US010906235B2

United States Patent
Gmeinwieser et al.

(10) Patent No.: US 10,906,235 B2
(45) Date of Patent: Feb. 2, 2021

(54) OPTOELECTRONIC SEMICONDUCTOR COMPONENT AND 3D PRINTER

(71) Applicant: OSRAM Opto Semiconductors GmbH, Regensburg (DE)

(72) Inventors: Nikolaus Gmeinwieser, Donaustauf (DE); Norwin von Malm, Nittendorf (DE)

(73) Assignee: OSRAM OLED GMBH, Regensburg (DE)

( * ) Notice: Subject to any disclaimer, the term of this patent is extended or adjusted under 35 U.S.C. 154(b) by 359 days.

(21) Appl. No.: 15/757,289

(22) PCT Filed: Sep. 8, 2016

(86) PCT No.: PCT/EP2016/071202
§ 371 (c)(1),
(2) Date: Mar. 2, 2018

(87) PCT Pub. No.: WO2017/045995
PCT Pub. Date: Mar. 23, 2017

(65) Prior Publication Data
US 2018/0272605 A1 Sep. 27, 2018

(30) Foreign Application Priority Data
Sep. 18, 2015 (DE) .................. 10 2015 115 810

(51) Int. Cl.
*B29C 64/129* (2017.01)
*H01L 27/15* (2006.01)
(Continued)

(52) U.S. Cl.
CPC .......... *B29C 64/129* (2017.08); *B29C 64/264* (2017.08); *B29C 64/295* (2017.08);
(Continued)

(58) Field of Classification Search
None
See application file for complete search history.

(56) References Cited

U.S. PATENT DOCUMENTS 9,362,335 B2 * 6/2016 von Malm ............ H01L 27/124
10,461,120 B2 * 10/2019 von Malm ............ H01L 33/62
(Continued)

FOREIGN PATENT DOCUMENTS

DE 102004012219 A1 6/2005
DE 102011056888 A1 6/2013
(Continued)

OTHER PUBLICATIONS

Tumbleston, J. R. et al., "Continuous Liquid Interface Production of 3D Objects," Science Magazine, vol. 347, Issue 6228, Mar. 20, 2015, 5 pages.

*Primary Examiner* — Alexander G Ghyka
(74) *Attorney, Agent, or Firm* — Slater Matsil, LLP (57) ABSTRACT

An optoelectronic semiconductor component and a 3D printer are disclosed. In an embodiment the component includes a carrier, a plurality of individually controllable pixels configured to emit radiation during operation, wherein the plurality of individual pixels is mounted on the carrier and is formed from at least one semiconductor material and a plurality of transport channels configured to transport a gas or a liquid through the semiconductor component in a direction transverse to and towards a radiation exit side of the semiconductor component, wherein the pixels are configured to emit radiation having a wavelength of maximum intensity of 470 nm or less, and wherein all pixels include the same semiconductor layer sequence and emit radiation of the same wavelength.

16 Claims, 5 Drawing Sheets

(51) Int. Cl.
    *H01L 33/46*     (2010.01)
    *B33Y 30/00*     (2015.01)
    *B29C 64/295*     (2017.01)
    *B29C 64/264*     (2017.01)
    *H01L 33/32*     (2010.01)
    *H01L 33/38*     (2010.01)

(52) U.S. Cl.
    CPC ............ *B33Y 30/00* (2014.12); *H01L 27/156* (2013.01); *H01L 33/32* (2013.01); *H01L 33/46* (2013.01); *H01L 33/382* (2013.01)

(56) References Cited

U.S. PATENT DOCUMENTS

| | | |
|---|---|---|
| 2005/0056855 A1 | 3/2005 | Lin et al. |
| 2010/0247795 A1 | 9/2010 | Heath |
| 2011/0309400 A1* | 12/2011 | Fukushima ....... H01L 21/02381 257/98 |
| 2012/0063131 A1 | 3/2012 | Jamar et al. |
| 2014/0238970 A1 | 8/2014 | Johnson et al. |
| 2015/0014716 A1* | 1/2015 | von Malm ............ H01L 27/124 257/89 |
| 2015/0072293 A1 | 3/2015 | DeSimone et al. |
| 2017/0104133 A1* | 4/2017 | Sogo ....................... H01L 33/62 |
| 2017/0213868 A1* | 7/2017 | Damilano ............ H01L 27/153 |
| 2019/0018279 A1* | 1/2019 | Wang ................ G02F 1/133617 |
| 2019/0198711 A1* | 6/2019 | Kim .................... H01L 33/0093 |
| 2020/0287076 A1* | 9/2020 | Choi ....................... H01L 33/46 |

FOREIGN PATENT DOCUMENTS

| | | |
|---|---|---|
| EP | 2226683 A1 | 9/2010 |
| WO | WO2013092304 A1 * | 6/2013 |
| WO | 2015091459 A1 | 6/2015 |
| WO | 2016048348 A1 | 3/2016 |

* cited by examiner

OPTOELECTRONIC SEMICONDUCTOR COMPONENT AND 3D PRINTER

This patent application is a national phase filing under section 371 of PCT/EP2016/071202, filed Sep. 8, 2016, which claims the priority of German patent application 10 2015 115 810.8, filed Sep. 18, 2015, each of which is incorporated herein by reference in its entirety.

TECHNICAL FIELD

The invention relates to an optoelectronic semiconductor component and a 3D printer.

SUMMARY OF THE INVENTION

Embodiments of the invention provide an optoelectronic semiconductor component and a 3D printer.

According to at least one embodiment, the optoelectronic semiconductor component comprises a carrier. The carrier may be the portion of the semiconductor component which mechanically carries and supports the latter. The carrier may be mechanically rigid, so that in the intended use of the semiconductor component no or no significant bending of the carrier takes place. In addition to a mechanical function, the carrier can be electronically functionalized. For example, the carrier then contains electronic components for controlling the semiconductor component.

According to at least one embodiment, the semiconductor component comprises a plurality of individually controllable pixels emitting radiation during operation. The pixels are each formed from or with at least one semiconductor material. For example, the pixels are formed by individual light-emitting diodes, LEDs for short. It is likewise possible for the pixels to be realized by image points within a light-emitting diode chip. Mixed forms thereof are also possible.

According to at least one embodiment, the pixels are attached to the carrier. For example, the pixels are soldered or adhesively bonded onto the carrier. It is likewise possible for the carrier itself to be a growth substrate of a semiconductor material for the pixels or that the carrier is different from a growth substrate.

According to at least one embodiment, the semiconductor component has a multiplicity of transport channels. The transport channels are set up in the intended use of the semiconductor component for transporting a gas and/or a liquid through the semiconductor component. The gas and/or the liquid are transported predominantly or exclusively in a direction transverse to a radiation exit side of the semiconductor component. Transverse means, in particular, at an angle not equal to 0° and thus not parallel to the radiation exit side, for example, at an angle of at least 45° or 60° and/or of at most 90° or 85°. The radiation exit side is in particular a plane, real or fictitious area at which the radiation generated in the semiconductor component during operation exits the latter. The radiation exit side may comprise partial or complete boundary surfaces and/or upper sides of the pixels at which the radiation is emitted.

According to at least one embodiment, the transport channels are designed to transport the gas or the liquid towards the radiation exit side, in particular exclusively towards the radiation exit side. This means that, in the intended use of the semiconductor component, no or no significant transport of a gas or a liquid takes place from the radiation exit side proceeding through the semiconductor component. In other words, the transport channels then form a type of one-way line for the gas and/or the liquid. The same transport direction or main transport direction may be present across the entire semiconductor component.

According to at least one embodiment, the pixels are designed to emit radiation having a wavelength of maximum intensity, also referred to as peak wavelength, of at most 470 nm or 420 nm or 380 nm. Alternatively or additionally, the wavelength of maximum intensity is at least 200 nm or 300 nm or 330 nm. In other words, ultraviolet radiation or blue light is emitted from the pixels.

In at least one embodiment, the optoelectronic semiconductor component comprises a carrier and a plurality of individually controllable, in operation radiation-emitting pixels. In this case, the pixels are formed from at least one semiconductor material and are mounted on the carrier. The semiconductor component contains a plurality of transport channels, which leads to a transport of a gas and/or a liquid through the semiconductor component in the direction transverse to and, within the semiconductor component, towards a radiation exit side of the semiconductor component. Furthermore, the pixels are intended to emit radiation having a wavelength of maximum intensity of 470 nm or less.

The optoelectronic semiconductor component described here makes it possible to realize a 3D printing method. In this case, a light-curable printing liquid is used, from which an object to be produced is constructed. The liquid is preferably illuminated optically directly layer by layer by the individual pixels, so that the object to be produced is composed of the illuminated and thus cured regions of the printing liquid. This is made possible, in particular, by the fact that the semiconductor component has transport channels for a liquid and/or for a gas, through which either the preprinting liquid itself or an inhibitor gas can be supplied to a printing chamber of the 3D printer. Such a semiconductor component has a high spatial resolution, and at the same time a high 3D printing speed can be achieved.

In conventional 3D printing methods, a 3D object is sequentially constructed from a powder bath by selectively heating or illuminating sub-regions of the powder. Such 3D printing processes are comparatively slow and therefore uneconomic for large-scale production of 3D objects, for example, of housings for light-emitting diode components. The publication John R. Tumblestone, "Continuous Liquid Interface Production of 3D Objects" in the journal Science, No. 347, Issue 6228 from Mar. 20, 2015, pages 1349 to 1352, discloses a 3D printing method. In this case, a two-dimensional image is projected into a printing fluid via a mirror through an oxygen-permeable membrane. A zone is located close to the oxygen-permeable membrane, in which a comparatively high oxygen content is present and in which there is thus no curing of the printing fluid. The 3D object to be produced is drawn in the direction away from the oxygen-permeable membrane, as a result of which printing fluid constantly flows successively from the sides. The disclosure content of this publication with regard to materials used for the printing liquid and the membrane, a determination of the thickness of the oxygen-containing layer on the membrane and advantageous illumination intensities is incorporated by reference.

With the semiconductor component described here, it is possible to dispense with intermediate optics and imaging units and to accelerate the 3D printing process. Likewise, high spatial resolutions can be achieved at the same time.

According to at least one embodiment, all pixels of the semiconductor component are produced from the same semiconductor layer sequence. By way of example, a semiconductor layer sequence is epitaxially grown on a growth substrate and subsequently patterned to form the pixels by etching. In particular, the semiconductor layer sequence is thus constructed identically across all pixels. A position of the pixels relative to each other may not be changed relative to the grown semiconductor layer sequence by etching and by positioning on the carrier. Furthermore, all pixels then emit radiation of the same wavelength within the scope of the production tolerances for the semiconductor layer sequence. Corresponding pixels and semiconductor layer sequences are known from the publication US 2015/0014716 A1, the disclosure content of which is incorporated by reference with regard to the carrier and the semiconductor layer sequence.

In this case, it is possible for a plurality of such semiconductor layer sequences, which each contain a plurality of pixels, to be again attached to the carrier in a matrix-like manner and thus form the semiconductor component.

According to at least one embodiment, a plurality of light-emitting diode chips or laser diode chips is located on the carrier. In this case, it is possible for each of the pixels to be formed by exactly one such chip. The light-emitting diode chips in particular are, for example, so-called flip-chips. In this case, the transport channels are formed, for example, through bores through the chips. Alternatively, the transport channels are arranged in interspaces between the chips, wherein a casting body, which can have holes for the transport channels, can be located between adjacent chips.

According to at least one embodiment, one or more or each of or the majority or each of the pixels is assigned to one or more of the transport channels. In particular, precisely one of the transport channels is assigned to each of the pixels. "Majority of the pixels" means, for example, at least 50% or 80% or 95% of the pixels. It is possible for the pixels to be synchronized to a control of the transport channels in the semiconductor component. In this case, a gas and/or a liquid is transported to the radiation exit side from a particular transport channel, for example, when the associated pixel is activated or an activation of the corresponding pixel is imminent.

According to at least one embodiment, all transport channels or at least some of the transport channels are located, viewed in a plan view, between adjacent pixels. Alternatively, it is possible that the transport channels or at least some of the transport channels, viewed in a plan view, are located within the pixels.

According to at least one embodiment, adjacent pixels are separated from one another by a trench. This means that the pixels can then project beyond remaining regions of the carrier and be formed as elevations.

According to at least one embodiment, barriers that are impermeable to the radiation are located between adjacent pixels. Optical isolation of the pixels from one another is achieved by means of said barriers. Preferably, the barriers surround the pixels all around in a closed path. In this case, the barriers can project beyond the pixels. This means that a material of the barriers then rises further above the carrier than the semiconductor material of the pixels. Alternatively, it is also possible that the barriers are flush with the pixels or that the pixels project beyond the barriers. The barriers can be formed from the same material as the carrier, that is to say, for example, from a semiconductor material, or of a material different from the carrier, for example, a metal, a plastic or a ceramic.

According to at least one embodiment, in a plan view, the transport channels are located on or in the barriers or also on or in the trenches between the pixels. An arrangement grid of the pixels can in this case be equal to an arrangement grid of the transport channels, seen in plan view.

According to at least one embodiment, the pixels comprise on side walls a coating that is impermeable to the radiation. The coating can have a reflective or also absorbing effect for the radiation generated in the pixels. A reflective coating is formed, for example, from a metal or a reflective potting which appears to be white, for example. An absorbing coating is formed, for example, from a dark or black plastic or photoresist or from a semiconductor material which has a smaller band gap than the radiation generated in the pixels. The coating is located in particular directly on the side walls or is separated from the side walls by an electrically insulating, transparent and preferably thin intermediate layer.

According to at least one embodiment, the reflective coating forms at least partially boundary walls of the transport channels. In other words, an optical isolation between the individual pixels as well as an optical isolation between the pixels and their associated transport channels can then be achieved by the reflective coating. The reflective coating can have a constant thickness or also exhibit a thickness variation.

According to at least one embodiment, the pixels taper in the direction away from the common carrier. In other words, a cross-sectional area of the pixels in the direction away from the carrier becomes smaller then. Side walls of the pixels can then be inclined towards the carrier. Alternatively or additionally, it is possible that the transport channels have a constant cross section in the direction perpendicular to the radiation exit side and thus do not become thinner or thicker.

According to at least one embodiment, the upper sides of the pixels facing away from the carrier are designed as a lens, in particular as a converging lens. In other words, the upper sides or at least a part of the upper sides are then convexly curved. As a result, an emission characteristic of the pixels can be set. Alternatively, the upper sides can be provided with microlenses or with a roughening for improving the outcoupling of light.

According to at least one embodiment, the pixels are each free of a phosphor. Thus, only radiation is emitted from the pixels and thus from the semiconductor component, as generated in an active zone of a semiconductor material for the pixels. In this case, a conversion of radiation into radiation having different wavelengths does not happen.

According to at least one embodiment, the carrier is formed from a semiconductor material, e.g., silicon. In other words, it is in particular a silicon carrier. The carrier may be produced from a silicon wafer and can have further components, for example, for conductor tracks. Furthermore, the carrier comprises drive transistors for the pixels. The pixels can be controlled individually and independently of one another via the drive transistors. The drive transistors are formed in particular in CMOS technology or as a TFT circuit in or on the carrier.

According to at least one embodiment, the pixels are located above the drive transistors, in particular when viewed in a plan view. In other words, the pixels are then applied to the associated drive transistors, preferably in a 1:1 assignment. Likewise preferably in a 1:1 assignment, the carrier comprises current drivers for the individual pixels. The pixels are thus located closer to the radiation exit side than the respectively associated drive transistors. The pixels preferably lie in a common plane, as can be the case for the drive transistors.

According to at least one embodiment, the pixels and/or radiation-emitting surfaces of the pixels, in a plan view, cover an area proportion of at least 15% or 25% or 40% of the radiation exit side. Alternatively or additionally, this area proportion is at most 75% or 50% or 40%. In order to determine the area proportion, preferably all pixels are surrounded with a smallest circumferential line, and the area within this circumferential line applies as the total area of the radiation exit side, seen in plan view.

According to at least one embodiment, the transport channels, taken together, amount to an area proportion of at least 10% or 15% or 25% on the radiation exit side. Alternatively or additionally, this area proportion is at most 60% or 45% or 30%. In other words, the transport channels take up a comparatively large proportion of the radiation exit side.

According to at least one embodiment, the pixels have an average edge length of at least 2 μm or 10 μm or 25 μm. Alternatively or additionally, the average edge length of the pixels is at most 500 μm or 200 μm or 100 μm. It is possible for a mean distance between adjacent pixels to amount to at least 1 μm or 5 μm or 10 μm and/or at most 100 μm or 50 μm or 25 μm.

According to at least one embodiment, the transport channels, in particular at the radiation exit side, have an average diameter of at least 2.5 μm or 5 μm or 20 μm and/or of at most 200 μm or 100 μm or 50 μm. In particular, the transport channels are set up for transporting liquids having a viscosity of at least 5 Pa·s or 10 Pa·s or 20 Pa·s and/or of at most 100 Pa·s or 50 Pa·s or 40 Pa·s. In the event of a liquid being transported through the channels, the transport channels may be designed for a volume flow rate of at least 0.4 ml/cm$^2$·min or 2 ml/cm$^2$·min or 10 ml/cm$^2$·min and/or of at most 20 ml/cm$^2$·min or 30 ml/cm$^2$·min or 100 ml/cm$^2$·min. This applies in particular to the cited viscosities.

According to at least one embodiment, the pixels each have an active zone. The active zone is preferably located between an n-conducting and a p-conducting semiconductor region of the pixels. The active zone is penetrated by electrical feedthroughs. In particular, the individual pixels are constructed as described in the publication US 2015/0014716 A1. In this way, it is possible that the upper sides of the pixels facing away from the carrier are free of electrodes or power supply lines for supplying current to the pixels.

Furthermore, a 3D printer is specified. The 3D printer preferably comprises at least one optoelectronic semiconductor component as indicated in connection with one or more of the above-mentioned embodiments. Features of the semiconductor component are therefore also disclosed for the 3D printer and vice versa.

According to at least one embodiment, the pixels are set up to irradiate a radiation-curable printing liquid with two-dimensional sectional images of a 3D object to be printed. The 3D object is assembled from a sequence of the two-dimensional sectional images.

According to at least one embodiment, the radiation exit side of the semiconductor component is shaped flat on average. Furthermore, the radiation exit side is preferably oriented parallel to the two-dimensional sectional images. Alternatively, it is possible for the radiation exit side to be curved, for example, in the form of a conical casing or a cylinder casing. By means of the last-mentioned embodiments, in particular rotationally symmetrical 3D objects can be produced.

According to at least one embodiment, the printing liquid is cured optically directly by the radiation emitted by the pixels. This means, for example, that no optically active element such as a mirror or a lens is mounted between the pixels and the printing liquid.

According to at least one embodiment, in the intended use of the printer, an inhibited zone is located between the pixels and a curing zone of the printing liquid. The curing zone in this case is an area in which, on account of the radiation through the pixels, curing and solidification of the printing liquid to the 3D object is carried out. In contrast, no or no significant curing of the printing liquid takes place in the inhibited zone.

In at least one embodiment, the 3D printer comprises one or more optoelectronic semiconductor components, in which a plurality of individually controllable pixels emitting ultraviolet radiation during operation is mounted on a carrier. The pixels are set up to generate two-dimensional sectional images of an object to be printed during the operation of the 3D printer, and to irradiate a printing liquid with corresponding sectional images, in order to assemble the 3D object by curing the printing liquid. In this case, a radiation exit side of the semiconductor component is preferably flat on average and the printing liquid is irradiated optically directly. An inhibited zone is located between the pixels and a curing zone of the printing liquid during operation of the printer; in the inhibited zone no curing of the printing liquid takes place.

According to at least one embodiment, the 3D printer comprises at least one optoelectronic semiconductor component as indicated in connection with one or more of the above-mentioned embodiments. In particular, the one or all the semiconductor components of the printer are designed in such a way, so that the printer then does not comprise any further optoelectronic semiconductor components which are set up for curing the printing liquid.

According to at least one embodiment, the inhibited zone has a thickness in the intended operation of the 3D print image which is at least 5% or 10% or 25% of a mean edge length of the pixels, wherein the average edge length of the pixels is determined in a plan view. Alternatively or additionally, the thickness of the inhibited zone is at most 300% or 200% or 100% of the average edge length of the pixels.

According to at least one embodiment, inhibition in the inhibited zone takes place by adding the gas, preferably by adding oxygen to the printing liquid. This means that the addition of gas, in particular oxygen, is achieved locally in the inhibited zone in such a way that no curing of the printing liquid can take place.

According to at least one embodiment, oxygen is added through a gas transport element. Since the gas transport element transports oxygen in particular, the gas transport element is referred to below as an oxygen transport element. Particularly preferably, the oxygen transport element is flat and has a planar shape. Furthermore, the oxygen transport element is preferably oriented parallel to the two-dimensional sectional images.

According to at least one embodiment, the oxygen transport element is in direct contact with the printing liquid. In particular, the inhibited zone adjoins the oxygen transport element in a planar and direct manner.

According to at least one embodiment, the oxygen transport element is a membrane, through which the gas, in particular oxygen, is transported. Furthermore, in this case, the oxygen transport element is permeable to the radiation emitted by the at least one semiconductor component during operation. In addition, the oxygen transport element preferably does not perform beam shaping. In other words, with regard to its optical function, the oxygen transport element is then designed as a plane-parallel, transparent sheet, within which or by means of which beam deflection, beam deviation or beam scattering is negligible. If the oxygen transport element is a membrane of this type, the semiconductor component further preferably directly adjoins a side of the oxygen transport element facing away from the printing liquid.

According to at least one embodiment, the oxygen transport element is formed by the at least one semiconductor component itself. In this case, the transport of the gas, in particular the oxygen, into the printing liquid takes place through the transport channels of the semiconductor component. The transport channels can be formed as micropores which are designed exclusively for transporting the gas. In particular, there is then no transport of the printing liquid or of further materials through the transport channels.

According to at least one embodiment, the printing liquid is transported through the transport channels of the at least one semiconductor component into a printing chamber of the 3D printer during operation of the 3D printer. In other words, the semiconductor component itself forms part of a transport mechanism for the printing liquid. The printing liquid in the transport channels is preferably admixed with gas, especially with oxygen, so that, directly after discharge of the printing liquid from the transport channels, curing of the printing liquid is inhibited on account of the gas, in particular of the oxygen.

According to at least one embodiment, the 3D printer and/or the semiconductor component comprises a heater. The heater is designed to reduce a viscosity of the printing liquid during transport through the transport channels. In this case, the heater can be integrated into the carrier of the at least one semiconductor component or be attached directly to the carrier. Alternatively, the heater is located at a distance from the carrier within the 3D printer.

According to at least one embodiment, the heater is set up in such a way that a temperature of the printing liquid when passing through the transport channels is at least 40° C. or 50° C. or 60° C. Alternatively or additionally, a temperature of the printing liquid of at most 100° C. or 80° C. or 60° C. in the transport channels is made possible by the heater.

According to at least one embodiment, the 3D printer is a stationary device. Alternatively, it is possible for the 3D printer to be designed as a hand-held device. The 3D printer can in each case be designed as an extruder.

The invention further relates to a 3D printing method. The method is carried out using a 3D printer as indicated in connection with one or more of the above-mentioned embodiments. Features of the method are therefore also disclosed for the 3D printer and for the optoelectronic semiconductor component, and vice versa.

BRIEF DESCRIPTION OF THE DRAWINGS

An optoelectronic semiconductor component described here and a 3D printer described here are explained in more detail below with reference to the drawings on the basis of exemplary embodiments. Identical reference signs indicate the same elements in the individual figures. In this case, however, no relationships to scale are illustrated; rather, individual elements can be represented with an exaggerated size in order to afford a better understanding.

In the Figures.

DETAILED DESCRIPTION OF ILLUSTRATIVE EMBODIMENTS

Figure 1:
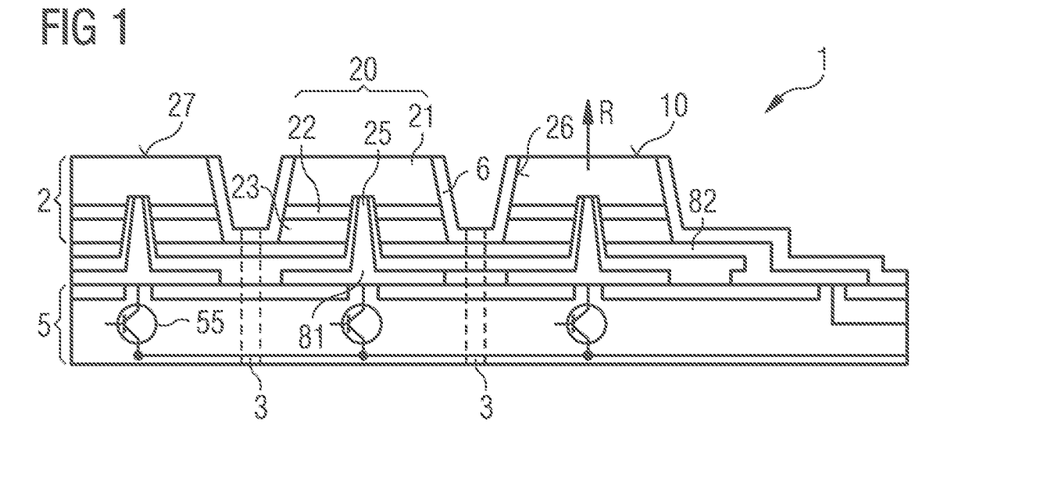
FIG. 1 to FIG. 6 and FIG. 14 show schematic sectional representations of exemplary embodiments of optoelectronic semiconductor components described here for 3D printers described here.

FIG. 1 shows an exemplary embodiment of an optoelectronic semiconductor component 1 for a 3D printer 9. The semiconductor component 1 comprises a carrier 5, in which drive transistors 55 are integrated in silicon technology. Pixels 20 can be electrically controlled via the drive transistors 55 and via electrodes 81, 82.

According to FIG. 1, the pixels 20 are produced from a single, contiguous semiconductor layer sequence 2. The pixels 20 thus each have an n-type semiconductor region 21 and a p-type semiconductor region 23, between which an active zone 22 is located. The n-type semiconductor region 21 is electrically contacted via the n-electrode 81 and via electrical feedthroughs 25. The flat p-type electrode 82 is located on the p-type semiconductor region 23.

For optical isolation of the pixels 20 from one another, a reflective coating 6 is applied to side walls 26 of the pixels 20. The reflective coating 6 is impermeable to a radiation R which is generated in the pixels 20. A radiation exit side 10 of the semiconductor component 1 comprises upper sides 27 of the pixels 20. All the upper sides 27 are flat and lie in the radiation exit side 10. In the direction away from the carrier 5, the individual pixels 20 become continuously narrower. The reflective coating 6 completely covers the side walls 26.

Furthermore, the semiconductor component 1 comprises transport channels 3, which are designed to transport gases and/or liquids through the semiconductor component 1. The transport channels 3 extend from an underside of the carrier 5, which faces away from the semiconductor layer sequence 2, into trenches between the pixels 20. The transport channels 3 also penetrate the reflective coating 6 so that each of the pixels 20 is associated with one or more of the transport channels 3. The transport channels 3 extend through the semiconductor component 1 in the direction perpendicular to the radiation exit side 10.

In contrast to the illustration in FIG. 1, it is optionally possible for a control unit to be assigned to each of the transport channels 3, via which a flow of the gas and/or the liquid can be controlled through the respective transport channel 3.

In the exemplary embodiment of FIG. 1, the pixels 20 have a common p-contact and individually controllable n-contacts. As an alternative to this, it is likewise possible for a common n-contact and individually controllable p-contacts to be present.

Optionally, as well as in all other exemplary embodiments, the upper sides 27 of the pixels 20 can be provided with a roughening over the whole surface or only in partial regions, in order to improve the coupling-out of radiation out of the pixels 20 in places.

According to FIG. 1, the active zone 22 and the n-type semiconductor region 21 are removed between adjacent pixels 20 in trenches. Deviating from the representation of FIG. 1, such trenches between the pixels 20 and thus also the reflective coating 6 can be entirely absent. In this case, the n-type semiconductor region 21, the p-type semiconductor region 23 and the active zone 22 can be present in a continuous manner.

In order to control local light output, a roughening that is present only in partial regions on the upper side 27 is then preferably used.

As in all other exemplary embodiments, the transport channels 3 can be located at crossing points of a grid formed by the pixels 20 or on side edges of the pixels 20.

Figure 2:
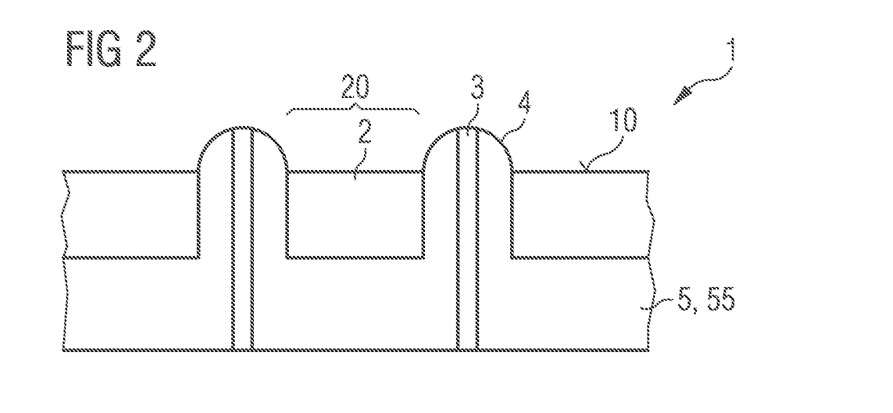

In the case of the exemplary embodiment of the semiconductor component 1 as shown in conjunction with FIG. 2, radiation-impermeable barriers 4 are located between the pixels 20. The barriers 4 project beyond the pixels 20, in the direction away from the carrier 5. The transport channels 3 lie within the barriers 4 on a side facing away from the carrier 5. The barriers 4 can be shaped concavely in cross section or, deviating from the illustration in FIG. 2, can also have flat, oblique side faces. As an alternative to the representation in FIG. 2, the barriers 4 can end flush with the pixels 20, in the direction away from the carrier 5.

As in all other exemplary embodiments, a shape of the pixels 20, seen in plan view, can be square, rectangular, circular, triangular or hexagonal. The pixels 20 can also be arranged in a square, rectangular or hexagonal grid, as seen in plan view. In a plan view of the radiation exit side 10, the transport channels 3, as in all other exemplary embodiments, have a circular base surface. It is likewise possible for the transport channels 3, seen in plan view, to be formed as elongated holes. The transport channels 3 can be located on side edges of the pixels or on crossing points of trenches or barriers, seen in a plan view.

An optical separation of the pixels 20 from one another is achieved by the barriers 4. Due to this optical isolation of the pixels 20 from one another, a higher print resolution can be achieved. By such barriers 4, as shown in connection with FIG. 2, it is possible that an opening of the transport channels 3 is located as far as possible away from the light-emitting upper sides 27 of the pixels 20. As a result, it is possible for an undesirable solidification of a printing liquid close to the pixels 20 to be prevented.

Figure 3:
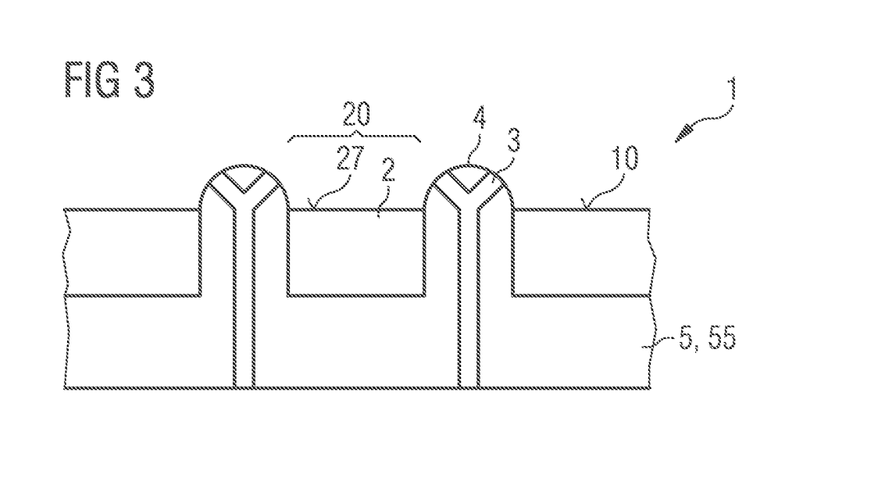

In the exemplary embodiment of the semiconductor component 1 of FIG. 3, the transport channels 3 are formed Y-shaped, seen in cross section and on a side facing away from the carrier 5. Thus, the transport channels 3 have a plurality of exit openings on the barriers 4. The exit openings point to a region directly above the upper sides 27. Such transport channels 3 can be produced, for example, by anisotropic etching along a plurality of directions. If the transport channels 3 lie approximately at a corner region of the pixels 20, a number of exit openings per transport channel 3 is preferably equal to a number of adjacent pixels 20, so that one of the exit openings can then be assigned to each of these pixels 20.

Figure 4:
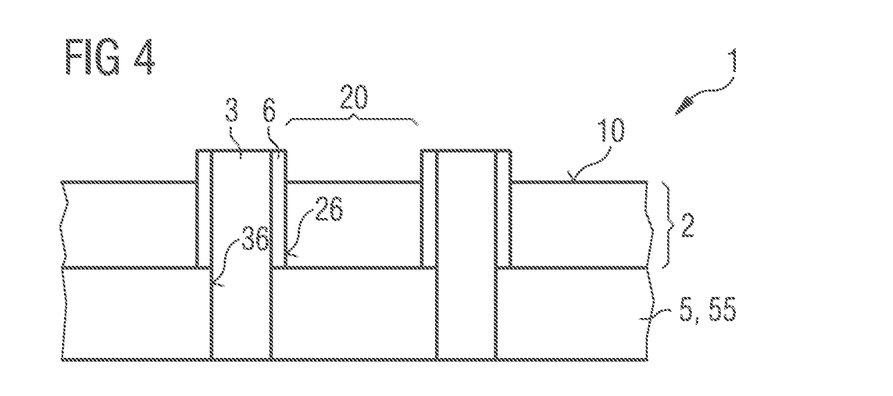

In the exemplary embodiment of FIG. 4, the reflective coatings 6 are applied to the side walls 26 of the pixels 20. The reflective coatings 6 simultaneously form boundary walls 36 of the transport channels 3, at least in the region of the semiconductor layer sequence 2. In this case, the reflective coatings 6 and the transport channels 3 can project beyond the semiconductor layer sequence 2, in the direction away from the carrier 5.

Figure 5:
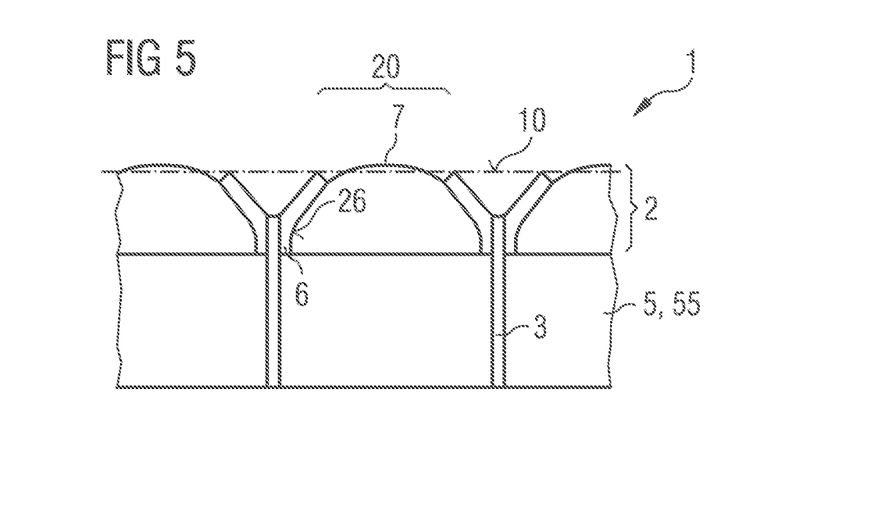

In FIG. 5 it can be seen that the pixels 20 and the semiconductor layer sequence 2 are shaped as convex lenses 7 when viewed in cross section. The radiation exit side 10 represents a central plane of the top sides of the lenses 7. The reflective coatings 6 cover the side walls 26 of the lenses 7 in part; openings of the transport channels 3 are displaced, relative to the radiation exit side 10, in the direction towards the carrier 5. The lenses 7 are preferably each formed mirror-symmetrically to axes perpendicular to the radiation exit side 10. Alternatively, the lenses 7 can be formed asymmetrically or can also be replaced by a plurality of microlenses.

Figure 6:
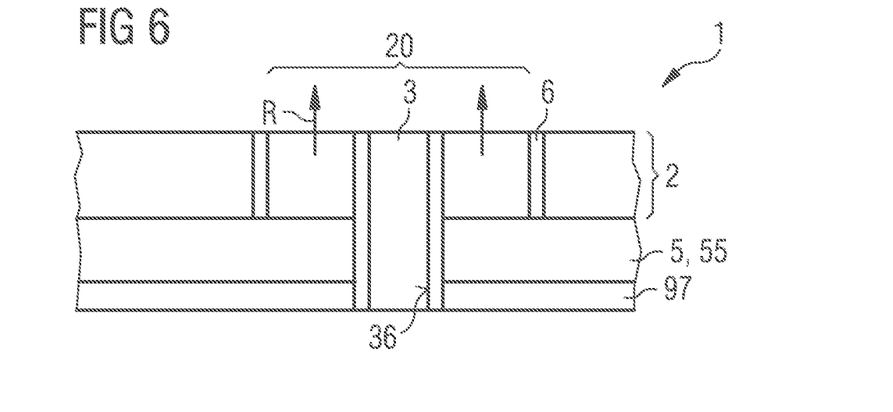

In the case of the exemplary embodiment of the semiconductor component 1 as illustrated in conjunction with FIG. 6, the transport channels 3 are located within the pixels 20 and not between the pixels 20, viewed in a plan view. In plan view, each of the transport channels 3 is then surrounded all around by a closed path of the associated pixel 20. Adjacent pixels 20 are separated from one another by the reflective coatings 6. In this exemplary embodiment, too, a control of the transport channels 3 and of the associated pixels 20 can be synchronized, so that, for example, a liquid exits from the transport channels 3 only when the associated pixel 20 is activated. The boundary walls 36 of the transport channels 3 are designed to be impermeable to the radiation R.

Optionally, as is also possible in all other exemplary embodiments, a heater 97 is arranged on the carrier 5. A temperature of a liquid to be guided through the transport channels 3 can be set via the heater 97, for example, in order to regulate a viscosity of this liquid.

Figure 7:
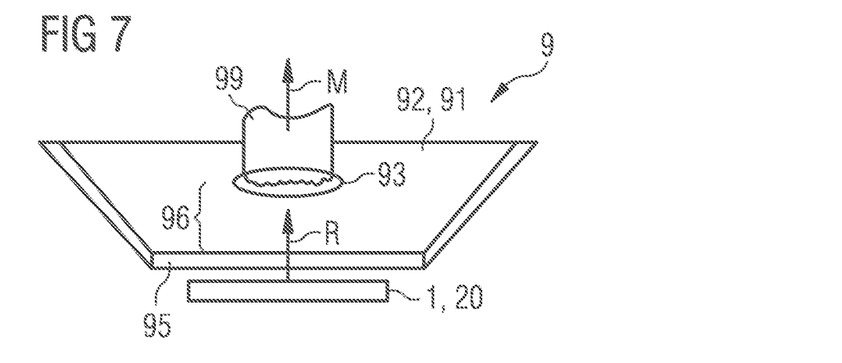
FIG. 7 to FIG. 13 show schematic sectional representations of exemplary embodiments of 3D printers described here.

FIG. 7 shows an exemplary embodiment of a 3D printer 9. A printing chamber 92 is at least partially filled with a radiation-curable printing liquid 91. A 3D object 99 to be produced is formed from said printing liquid 91. An oxygen transport element 95 is located on a bottom surface of the printing chamber 92. The oxygen transport element 95 is designed as a radiation-permeable and oxygen-permeable membrane. Oxygen enters the printing liquid 91 through the oxygen transport element 95, so that an inhibited zone 96 results between the object 99 and the element 95, in which zone no radiation curing takes place by the radiation R. A curing zone 93 is located on the object 99. In the curing zone 93, a proportion of free oxygen is reduced to such an extent that curing can take place by means of the radiation R.

The source for the radiation R is an optoelectronic semiconductor component 1 as explained in conjunction with FIGS. 1 to 6. In contrast to the illustration according to FIG. 7, the semiconductor component 1 is preferably located directly on the oxygen transport element 95 and oxygen is then guided through the transport channels 3 of the semiconductor component 1 to the oxygen transport element 95.

The 3D object is assembled from two-dimensional sectional images. The sectional images are directly realized as luminous surfaces via the pixels 20. As a result, no imaging projection optical system is required between the object 99 and the semiconductor component 1. In particular, a liquid crystal display, for short LCD, or a digital projection mirror, for short digital mirror device or DMD, can be omitted. Particularly preferably, the semiconductor component with the pixels 20 covers the entire base area of the 3D object 99 to be produced. In this case, a single semiconductor component 1 can be used, as illustrated in FIG. 7, or else a plurality of semiconductor components arranged directly next to one another can be used.

Figure 8:
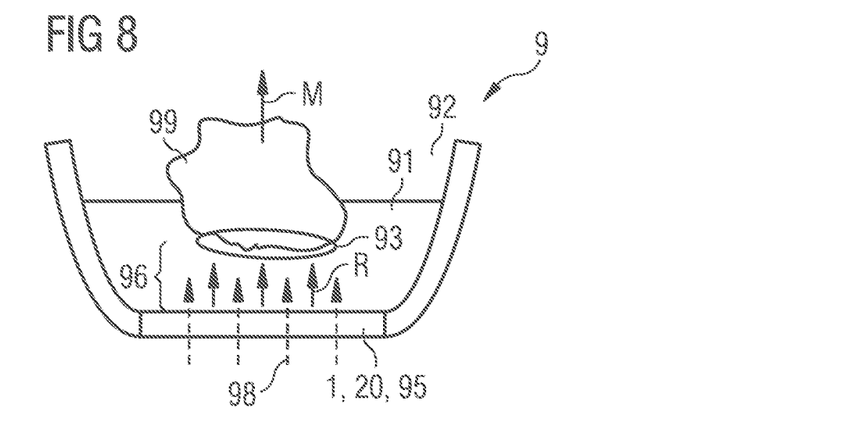

In the exemplary embodiment of FIG. 8, the oxygen transport element 95 is formed directly by the semiconductor component 1 with the pixels 20. Oxygen 98 passes through the transport channels directly into the printing liquid 91. The 3D object 99 to be printed is drawn out of the printing chamber 92 along a direction of movement M and thus out of the radiation-curable liquid 91. As a result of this extraction along the direction of movement M, printing liquid 91 always flows back into the region between the semiconductor component 1 and object 99 to be produced. According to FIG. 8, the printing liquid 91 is thus supplied laterally within the printing chamber 92 and only the oxygen 98 passes through the transport channels.

As in all other exemplary embodiments, the semiconductor layer sequence of the semiconductor component 1 is preferably formed from a III-V semiconductor material, in particular from the material system AlInGaN. A wavelength of maximum intensity of the radiation R from the pixels 20 is preferably at least 200 nm or 360 nm and/or at most 410 nm or 470 nm.

The printing liquid 91 can be present in liquid or alternatively in particle form, optionally in a solvent. If particles are present, particle sizes are preferably in the range of at least 10 nm to at most 10 μm. The printing liquid 91 is preferably an ormocer, as described, for example, in the publication WO 2013/156325 A1. The disclosure content of this publication with regard to ormocers is incorporated by reference.

The pixels 20 can also be individual light-emitting diode chips. Said light-emitting diode chips are then preferably so-called flip chips, whose electrical contact surfaces are located on a side facing away from the printing liquid 91 and/or which are electrically contacted via photolithographically structured conductor tracks. Preferably, device concepts are used, as illustrated in conjunction with FIG. 1, which are free of electrical leads on the upper sides 27. If, as an alternative thereto, bonding wires are present, these are preferably embedded in a protective potting for protection against the printing liquid 91, for instance made of a titanium dioxide-containing silicone. Likewise, a ceramic layer or a glass layer can be used as a topmost protective layer of the semiconductor component 1, for example, in the form of a thin glass plate or a ceramic plate. In this case, the transport channels 3 are not covered by such a protective layer.

Figure 9:
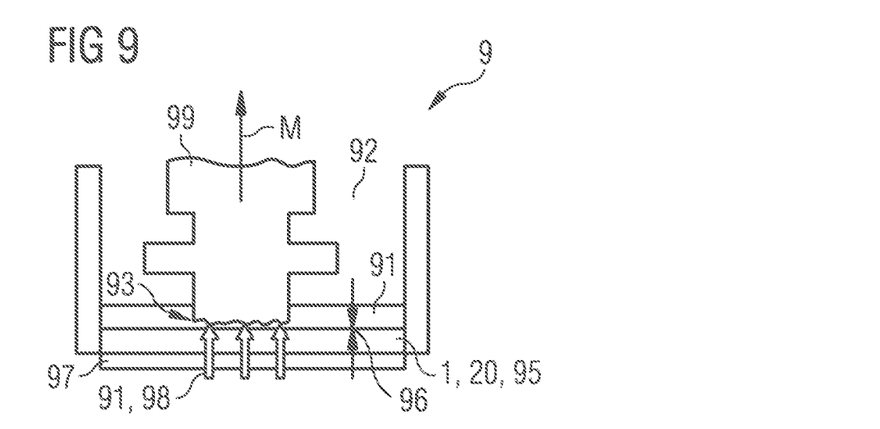

In the exemplary embodiment of the 3D printer 9 as illustrated in FIG. 9, both the printing liquid 91 and the oxygen 98 are transported through the semiconductor component 1. The inhibited zone 96 can then be designed to be comparatively thin. In the printing chamber 92, there is then in particular only the object 99 and excess printing liquid 91. With a precise control of the quantity of the printing liquid 91 through the semiconductor component 1, it is possible that the printing chamber 92 is substantially free of excess printing liquid 91.

Thus, according to FIG. 9, the printing liquid which is admixed with oxygen is supplied through the transport channels of the highly pixelated semiconductor component 1. Due to the oxygen 98, a thin layer in the form of the inhibited zone 96 is formed directly above the semiconductor component 1, said thin layer is not radiation-curable. The desired pattern in the respective sectional plane of the object 99 to be produced is assembled by the micropixelated, UV-radiation-R-emitting pixels 20.

It is not necessary for the already cured object 99 to be moved in the direction perpendicular to the semiconductor component 1 out of the printing liquid 91, since the material can be supplied through the semiconductor component itself. In the 3D printer 9 of FIG. 9, the object 99 can thus be pulled out or pulled away in principle in any desired direction of movement M.

As a result of replacing image-producing projection systems by optoelectronic semiconductor components 1 described here with the large number of pixels 20, a compact and fast 3D printer 9 can be realized. The individual controllability of the pixels and, if appropriate, of the transport channels 3 makes it possible to produce 3D objects 99 which can be shaped in a variety of geometries. Due to the pixels 20, a resolution can be very high and can be determined essentially by a size of the pixels of the semiconductor component 1.

Figure 10:
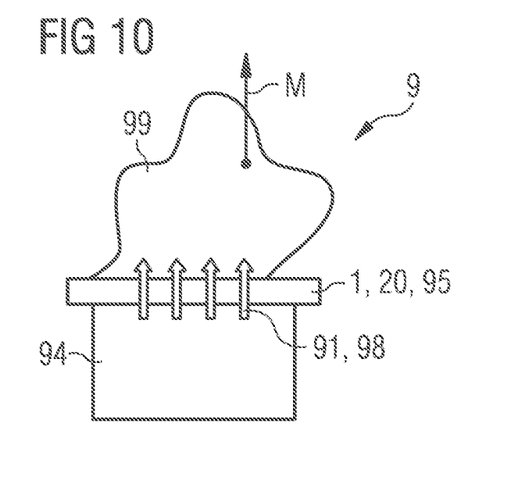

In the exemplary embodiment of FIG. 10, the transport of the printing liquid 91 through the transport channels 3 is controlled or is self-regulated by capillary forces. As a result, a macroscopic liquid film of excess printing liquid 91 on the semiconductor component 1 can be avoided. A collecting vessel for surplus printing liquid 91 can thus be dispensed with.

Figure 11:
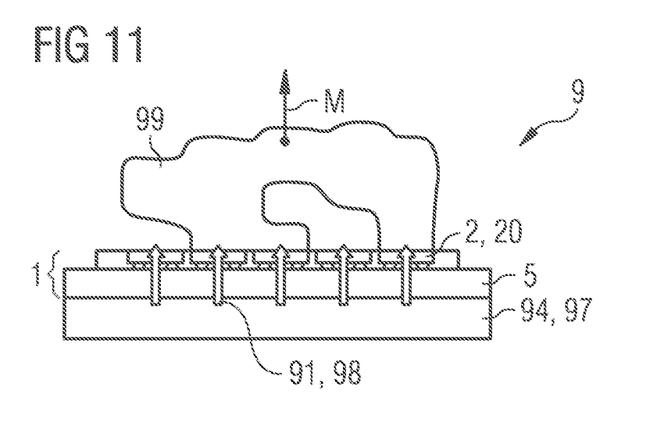

A further exemplary embodiment is shown in FIG. 11. The semiconductor component 1 comprises a plurality of individual light-emitting diode chips or laser diode chips, each of which forms one of the pixels 20 which are mounted together on the carrier 5. The light-emitting diode chips or laser diode chips are preferably flip-chips, in which all electrical contact surfaces face the carrier 5. The printing liquid 91 and oxygen 98 are preferably transported through a bore through the light-emitting diode chips or laser diode chips. Alternatively to the representation of FIG. 11, it is also possible that the chips are free of bores and that the transport channels are located between adjacent chips when viewed in plan view, wherein a not-shown planarization can be located between adjacent chips, analogously to the barriers which accommodate the transport channels.

In this exemplary embodiment, it is possible for the individual pixels 20 to have comparatively large geometric dimensions, which can be equal to the dimensions of the individual light-emitting diode chips or laser diode chips. The larger pixels 20 are accompanied by a lower resolution for the 3D object 99. However, comparatively large 3D objects 99 can be produced efficiently and quickly.

Figure 12:
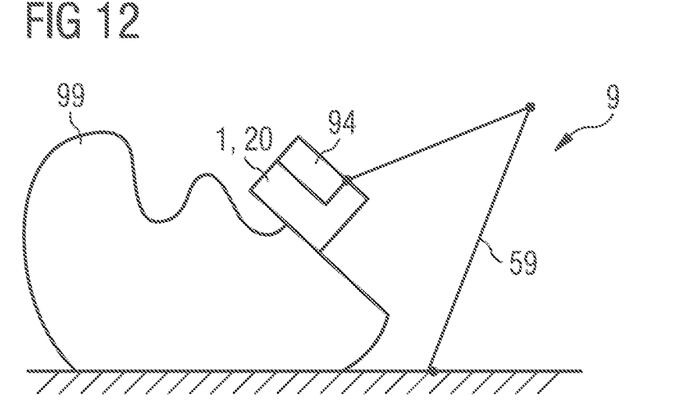

According to FIG. 12, the semiconductor component 1 is located on a carrier arm 59, which preferably has a plurality of hinges and can thereby be tilted as desired and can be moved through the space provided for the 3D object 99. Optionally, a reservoir 94 for the required printing liquid 91 is located on the carrier arm 59 and on the semiconductor component 1, and the printing liquid 91 can already be enriched with sufficient oxygen in the reservoir 94. Alternatively, the printing liquid 91 can be guided through feed lines (not shown) approximately along the carrier arm 59 towards the semiconductor component 1. As a result of the pixelated semiconductor component 1, it is possible at moderate travel paths of the carrier arm 59 to precisely shape the 3D object 99.

Figure 13:
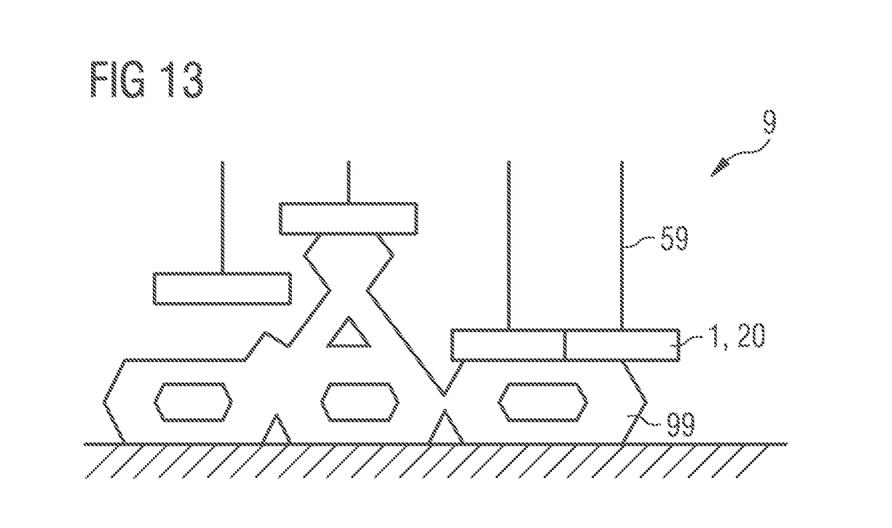

In the exemplary embodiment of FIG. 13, a plurality of print heads are present, wherein each of the print heads has a pixelated semiconductor component 1. The print heads can preferably be moved independently of one another, for example, in each case along a vertical direction. The 3D object 99 can thus be built up from a base surface. A large 3D object 99 can be achieved with a high spatial resolution by means of the different print heads.

Alternatively to the representations of FIGS. 7 to 13, it is possible that the semiconductor component is formed as a type of pen which can be guided through the printing chamber 92 in a freeform in order to produce the object 99. This applies in particular when oxygen exits from the transport channels 3, so that an inhibited zone is present in a thin zone immediately at the semiconductor component 1, which is formed as the 3D writing pen.

Figure 14:
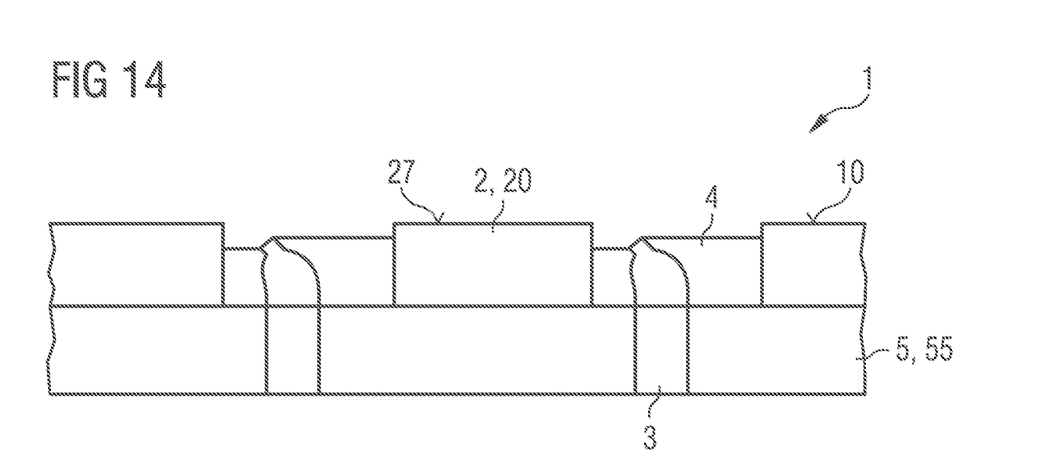

FIG. 14 illustrates a further exemplary embodiment of the semiconductor component 1. Deviating from FIGS. 2 and 3, the barriers 4 project from the pixels 20, in the direction away from the carrier 5. The barriers 4 can be produced of a material different from the carrier 5, for example, from a plastic.

Optionally, the transport channels 3 in the barriers 4 are formed as nozzles. As a result, it is possible for the printing liquid 91 to be introduced in a targeted and selective manner in a region preferably above the respectively associated pixel 20. Nozzle-shaped transport channels 3 can also be used in all other exemplary embodiments.

By means of such 3D printers 9, which can be used on a large scale, in particular lens designs or housing designs are possible which can be used, for example, for light-emitting diode chips. In the same way, optical elements such as lenses can be selectively printed onto individual objects such as LED-chips or are printed in a targeted manner as housings around individual LED chips, for example, as freeform-shaped side walls. In particular in the production of light-emitting diode components, printing in the wafer composite or in a housing panel can also be realized, wherein a plurality of print heads can be arranged in such a manner that several identically constructed or also different optical elements can be produced by means of LED units of a wafer.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. An optoelectronic semiconductor component comprising:
   a carrier;
   a plurality of individually controllable pixels configured to emit radiation during operation, wherein the plurality of individual pixels is mounted on the carrier and is formed from at least one semiconductor material; and
   a plurality of transport channels configured to transport a gas or a liquid through the semiconductor component in a direction transverse to and towards a radiation exit side of the semiconductor component,
   wherein the pixels are configured to emit radiation having a wavelength of maximum intensity of 470 nm or less, and
   wherein all pixels comprise the same semiconductor layer sequence and emit radiation of the same wavelength.

2. The optoelectronic semiconductor component according to claim 1,
   wherein a semiconductor layer sequence comprises AlInGaN,
   wherein the wavelength of maximum intensity is in a range of 365 nm to 470 nm,
   wherein the transport channels are configured to transport liquid with a viscosity of between 10 Pa·s and 50 Pa·s inclusive and a volume flow of between 2 ml/cm²·min and 30 ml/cm²·min inclusive, and
   wherein most or each of the pixels comprise one or more of the transport channels, and the transport channels, viewed in plan view, are located between adjacent pixels.

3. The optoelectronic semiconductor component according to claim 1, further comprising barriers, which are impermeable to the radiation, are arranged between adjacent pixels to optically isolate the pixels from one another, wherein the barriers project beyond the pixels, and wherein the transport channels are accommodated in the barriers.

4. The optoelectronic semiconductor component according to claim 1, further comprising a coating, which is impermeable to the radiation, is located at side walls of the pixels.

5. The optoelectronic semiconductor component according to claim 4, wherein the coating is reflective and at least partially forms boundary walls of the transport channels.

6. The optoelectronic semiconductor component according to claim 1, wherein the pixels taper in the direction away from the carrier, and wherein upper sides of the pixels facing away from the carrier are designed as converging lenses.

7. The optoelectronic semiconductor component according to claim 1, wherein the carrier is a silicon carrier and comprises drive transistors for the pixels, and wherein the pixels are located in a plane lying closer to the radiation exit side than the drive transistors.

8. The optoelectronic semiconductor component according to claim 1, wherein the pixels, taken together and in plan view, have an areal proportion of between 25% and 50% of the radiation exit side and the transport channels, taken together and in plan view, have an areal proportion of between 15% and 45%.

9. The optoelectronic semiconductor component according to claim 1, wherein the pixels have an average edge length of between 2 µm and 200 µm inclusive, and wherein an average diameter of the transport channels at the radiation exit side is between 5 µm and 100 µm inclusive.

10. The optoelectronic semiconductor component according to claim 1, wherein the pixels have an active zone which is penetrated by electrical feedthroughs so that upper sides of the pixels facing away from the carrier are free of electrodes for energizing the pixels.

11. A 3D printer comprising:
    at least one optoelectronic semiconductor component, the component comprising:
      a carrier; and
      a plurality of individually controllable pixels configured to emit radiation during operation, wherein the plurality of pixels is mounted on the carrier and comprises least one semiconductor material,
      wherein the pixels are configured to emit radiation having a wavelength of maximum intensity of 470 nm or less,
      wherein the pixels are configured to irradiate a radiation-curable printing liquid with two-dimensional sectional images of a 3D object to be printed so that the 3D object is composed of a sequence of the two-dimensional sectional images,
      wherein a radiation exit side of the semiconductor component is shaped flat on average and is oriented parallel to the two-dimensional sectional images,
      wherein an inhibited zone is located between the pixels and a curing zone of the printing liquid, the inhibited zone being defined as a zone of no curing of the printing liquid during operation,
      wherein all pixels comprise the same semiconductor layer sequence and emit radiation of the same wavelength,
      wherein at least one transport channel is allocated to a pixel for each pixel, and
      wherein the transport channel, seen in plan view, is arranged between adjacent pixels.

12. The 3D printer according to claim 11, further comprising an oxygen transport element,
    wherein the inhibited zone has a thickness between 10% and 200% inclusive of a mean edge length of the pixels, and wherein the oxygen transport element is configured to provide oxygen so that the printing liquid is inhibited from being cured in the inhibited zone by adding oxygen to the printing liquid, wherein the oxygen transport element is in direct contact with the printing liquid and an intermediate space between the pixels and the curing zone is free of a beam-determining optical element.

13. The 3D printer according to claim 12, wherein the semiconductor component is the oxygen transport element and during operation the oxygen is added to the printing liquid through the transport channels of the semiconductor component.

14. The 3D printer according to claim 12, wherein, during operation, the printing liquid flows through the transport channels of the semiconductor component into a printing chamber of the 3D printer.

15. The 3D printer according to claim 14, wherein the semiconductor component comprises a heater, or wherein a heater is mounted on the semiconductor component, and wherein the heater is configured to reduce a viscosity of the printing liquid during transport through the transport channels.

16. The 3D printer according to claim 12, further comprising a heater, wherein the heater is arranged at a distance from the semiconductor component and is configured to reduce a viscosity of the printing liquid during transport through the transport channels.

* * * * *